(12) United States Patent
Kokubo et al.

(10) Patent No.: US 6,679,317 B2
(45) Date of Patent: Jan. 20, 2004

(54) COOLING DEVICE BOILING AND COOLING REFRIGERANT, WITH MAIN WICK AND AUXILIARY WICK

(75) Inventors: Akihisa Kokubo, Kariya (JP); Tadayoshi Terao, Toyoake (JP)

(73) Assignee: Denso Corporation, Kariya (JP)

( * ) Notice: Subject to any disclaimer, the term of this patent is extended or adjusted under 35 U.S.C. 154(b) by 232 days.

(21) Appl. No.: 10/007,240

(22) Filed: Oct. 22, 2001

(65) Prior Publication Data

US 2002/0050344 A1 May 2, 2002

(30) Foreign Application Priority Data

Oct. 31, 2000 (JP) ........................................ 2000-333302

(51) Int. Cl.[7] .............................................. F28D 15/00
(52) U.S. Cl. ........................... 165/104.26; 165/104.33; 165/133; 257/715; 361/700
(58) Field of Search ...................... 165/104.26, 104.33, 165/133; 361/700; 257/715; 174/15.2, 16.3

(56) References Cited

U.S. PATENT DOCUMENTS

| 4,012,770 A | * | 3/1977 | Pravda et al. ................. 357/82 |
| 5,198,889 A | * | 3/1993 | Hisano et al. ............... 257/678 |
| 5,305,184 A | * | 4/1994 | Andresen et al. ........... 361/699 |
| 5,704,416 A | * | 1/1998 | Larson et al. ........... 165/104.33 |
| 5,880,524 A | * | 3/1999 | Xie .............................. 257/704 |
| 6,085,831 A | * | 7/2000 | DiGiacomo et al. ... 165/104.33 |
| 6,227,287 B1 | * | 5/2001 | Tanaka et al. .............. 165/80.4 |
| 6,227,288 B1 | * | 5/2001 | Gluck et al. ........... 165/104.26 |
| 6,474,074 B2 | * | 11/2002 | Ghoshal ........................ 62/3.7 |
| 6,608,752 B2 | * | 8/2003 | Morris et al. ................ 361/700 |

FOREIGN PATENT DOCUMENTS

| JP | A-10-209355 | 8/1998 |
| JP | A-10-209356 | 8/1998 |
| JP | A-11-87583 | 3/1999 |

* cited by examiner

Primary Examiner—Henry Bennett
Assistant Examiner—Nihir Patel
(74) Attorney, Agent, or Firm—Harness, Dickey & Pierce, PLC

(57) ABSTRACT

In a cooling device for cooling a heat-generating member, a refrigerant tank includes a heat-receiving wall onto which the heat-generating member is attached in an attachment area, and a radiation wall opposite to the heat-receiving wall. A main wick is provided on an approximate entire inner surface of the heat-receiving wall, and an auxiliary wick is arranged opposite to at least a middle portion of an inner surface of the radiation wall within the attachment area. Condensation fins are provided to protrude from an inner surface of the radiation wall, and are separately arranged on both sides of the auxiliary wick. In the cooling device, the auxiliary wick is connected to the main wick and condensation fins.

11 Claims, 5 Drawing Sheets

COOLING DEVICE BOILING AND COOLING REFRIGERANT, WITH MAIN WICK AND AUXILIARY WICK

CROSS-REFERENCE TO RELATED APPLICATION

This application is based upon and claims the benefit of Japanese Patent Application No. 2000-333302 filed on Oct. 31, 2000, the contents of which are incorporated herein by reference.

BACKGROUND OF THE INVENTION

1. Field of the Invention

The present invention relates to a cooling device for cooling a heat-generating member such as a semiconductor device by boiling and condensing refrigerant.

2. Description of Related Art

In recent years, due to a demand for portable terminals and the like, there has been a need for cooling devices which can be used in any attitude. Also, with a remarkable improvement of a processing in a personal computer, a heat amount emitted from a semiconductor integrated circuit such as a CPU is increased. Thus, miniaturization and high efficiency are demanded for the cooling devices.

In order to meet such a need, in a cooling device of JP-A-10-209355, JP-A-10-209356 or JP-A-11-87583, a refrigerant tank is formed from a sealed tank having a pair of faced walls, a heat-generating member (CPU) is fixed on one (heat-receiving wall) of the faced walls of the sealed tank, a radiation fin is fixed on the other one (radiation wall) of the faced walls, and a predetermined amount of refrigerant is stored in the sealed tank. In a side situation where the CPU is mounted on a side wall of the sealed tank (i.e., the faced walls described above are arranged vertically), a liquid surface of the refrigerant in the tank may become lower than a mounting portion of the CPU. Thus, in some cooling devices, a main wick (porous metallic sintered body) for transporting liquid refrigerant to a portion corresponding to the mounting position of the CPU by a capillary action is provided in the tank. In addition, in order to improve a cooling capacity of the cooling device, a condensation fin is provided on an inner surface of the radiation wall (condensation plane) so that heating-transmitting area (condensing area) is increased. However, in this case, liquid refrigerant readily stays in a lower side of the condensation fin and clearances of the condensation fin due to a surface tension of liquid refrigerant. Accordingly, the condensing area of gas refrigerant can not be effectively increased, and a sufficient cooling capacity can not be obtained.

SUMMARY OF THE INVENTION

In view of the foregoing problems, it is an object of the present invention to provide a cooling device in which a main wick and an auxiliary wick are disposed in a tank to improve cooling capacity.

According to an aspect of the present invention, in a cooling device, a main wick, for transporting liquid refrigerant to an attachment area of a heat-generating member in a tank, is provided on an inner surface of a heat-receiving wall of the tank, a plurality of condensation fins are disposed on the radiation wall in the tank, and an auxiliary wick is disposed in the tank for connecting the main wick and the condensation fins. The auxiliary wick is arranged at least opposite to a part of the attachment area of the heat-generating member. Therefore, a vapor refrigerant boiled in the tank within attachment area can flow toward around the auxiliary wick, and flows vapor passages between adjacent condensation fins. Therefore, the vapor refrigerant is liquefied on the condensation fins, and condensed liquid refrigerant is readily transported to the main wick through the auxiliary wick. Accordingly, the refrigerant can efficiently circulate in the refrigerant tank without being disturbed by the auxiliary wick.

Preferably, the auxiliary wick is disposed to opposite to a center line of the attachment area. More preferably, the auxiliary wick extends in the tank from one end to the other end. Accordingly, vapor refrigerant can be readily introduced into the condensation fins on both sides of the auxiliary wick without being affected by the auxiliary wick, and condensed liquid refrigerant can be readily introduced into the main stack through the auxiliary wick.

According to an another aspect of the present invention, a main wick is disposed in the tank to contact the heat-receiving wall, and an auxiliary wick for connecting the main wick and the condensation fins is disposed at an end of the closed space in the tank. Therefore, vapor refrigerant boiled by receiving heat from the heat-generating member is readily flows from the main wick to the condensation fins without being affected by the auxiliary wick, and condensed liquid refrigerant on the condensation fins can be readily introduced into the main wick through the auxiliary wick.

BRIEF DESCRIPTION OF THE DRAWINGS

Additional objects and advantages of the present invention will be more readily apparent from the following detailed description of preferred embodiments when taken together with the accompanying drawings, in which.

DETAILED DESCRIPTION OF THE PRESENTLY PREFERRED EMBODIMENTS

Preferred embodiments of the present invention will be described hereinafter with reference to the accompanying drawings.

First Embodiment

Figure 1B:
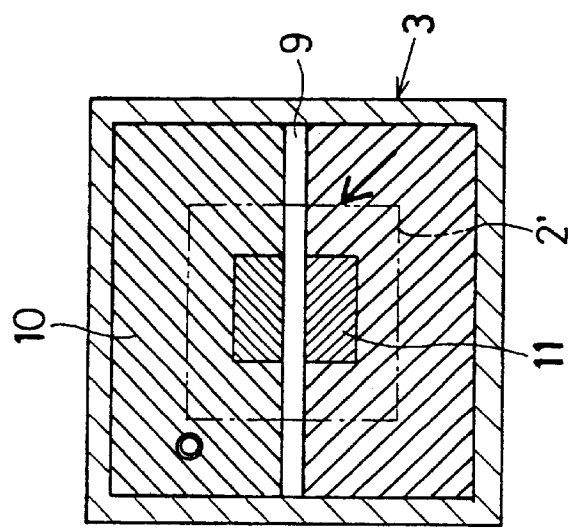
FIG. 1B is a cross-sectional view of the cooling device taken along line IB—IB in FIG. 1A, according to a first preferred embodiment of the present invention.
Figure 1A:
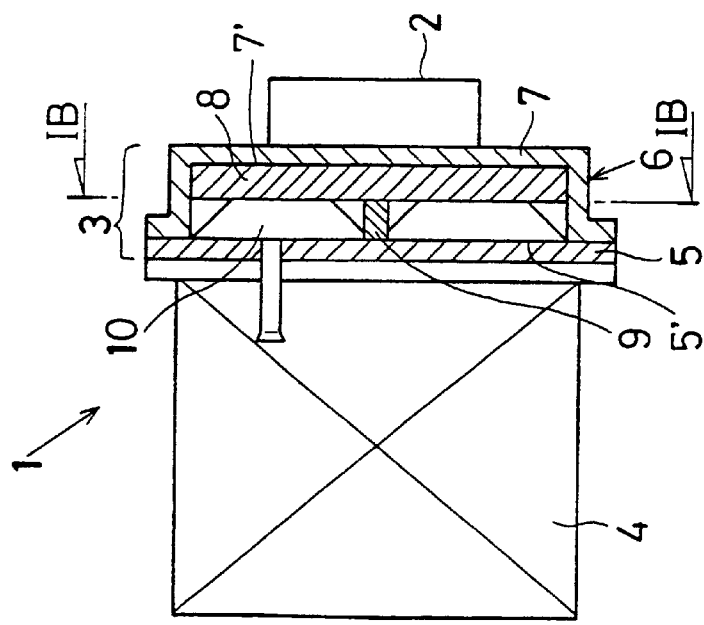
FIG. 1A is a schematic sectional view showing a cooling device.

A cooling device 1 shown in FIGS. 1A and 1B is for cooling a heat-generating member such as a CPU 2 mounted on a substrate of a computer. The cooling device 1 is constructed by a refrigerant tank 3, a radiation fin 4 and the like.

In the refrigerant tank 3, as shown in FIG. 1A, a radiation wall 5 formed by a plate member and a box-shaped case 6 are bonded so as to form a closed space in which a predetermined amount of refrigerant (e.g. water, alcohol) is contained. The radiation wall 5 and the case 6 are made of metal having a sufficient heat conductivity (e.g. copper, aluminum).

The CPU 2 is adhered onto a middle part of a bottom wall (hereinafter a heat-receiving wall 7) of the case 6, opposite to the radiation wall 5, as shown in FIG. 1A. Hereinafter, a region, where the CPU 2 is mounted as shown by the chain line in FIG. 1B, is referred to as an attachment area 2' of the heat-generating member 2.

In the refrigerant tank 3, a main wick 8, an auxiliary wick 9 and condensation fins 10 are provided. The main wick 8 is made of a porous metallic sintered body having a regular thickness and has an area size approximately equal to an inner surface (a boiling plane 7') of the heat-receiving wall 7. The main wick 8 is disposed to approximately contact an entire surface of the boiling plane 7'. The auxiliary wick 9 is provided to be connected to the main wick 8 and the condensation fins 10 so that condensed liquid refrigerant on the surfaces of the condensation fins 10 is transported to the main wick 8 through the auxiliary wick 9. For example, the auxiliary wick 9 is made of the same porous metallic sintered body, similarly to the main wick 8. The auxiliary wick 9 is formed into a stick-shape having a rectangular section, and sandwiched between the main wick 8 and an inner surface (a condensation plane 5') of the radiation wall 5 to extend in an approximate middle line of the condensation plane 5'. (see FIG. 1B)

The condensation fins 10 are used for increasing an condensing area of vapor refrigerant on the radiation wall 5. Each of the condensation fins 10 is protrusively formed into a reversed V-shape toward the main wick 8 on the condensation plane 51, and plural condensation fins 10 are continuously arranged. The condensation fins 10 are formed to protrude from the inner surface of the radiation wall 5 to be tapered toward the main wick 8. Therefore, an approximate V-shaped space is defined between adjacent two condensation fins 10. Vapor (gas) refrigerant boiled by receiving a heat from the CPU flows in the V-shaped spaces (vapor passages). As shown in FIG. 1B, the condensation fins 10 are separately provided on both sides of the auxiliary wick 9, and obliquely arranged by a predetermined angle (e.g. by 45°) with respect to the auxiliary wick 9 so that a direction of fin-arrangement of one side is reversed to the other side with respect to the auxiliary wick 9.

Figure 2:
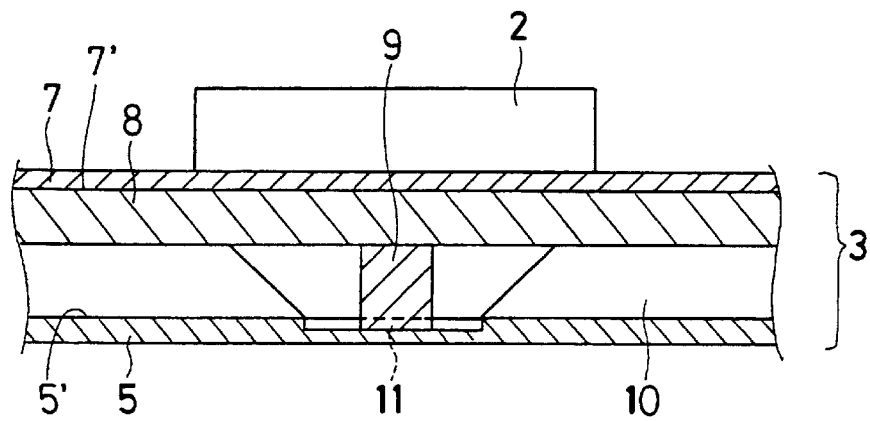
FIG. 2 is a partial enlarged cross-sectional view of the cooling device according to the first embodiment.

As shown in FIG. 1A, longitudinal end surfaces of each condensation fin 10 are cut to be tilted by a predetermined angle (e.g. 45°) so that spaces are provided between the auxiliary wick 9, the main wick 8 and the tilted end surfaces of the condensation fins 10, and between an inner surface of the case 6, the main wick 8 and the tilted end surfaces of the condensation fins 10. The spaces are used as an inlet and an outlet of the vapor passages. Further, as shown in FIGS. 1B and 2, the condensation fins 10 are not provided in a middle part of the radiation wall to have a rectangular recess in the radiation wall 5, within a range in the attachment area 2'. In the middle part of the condensation plane 5' where the condensation fins 10 are not provided, plural drains 11 are provided in parallel to be recessed from the inner surface of the radiation wall 5. As shown in FIG. 1B, the drains 11 are obliquely arranged in the same direction of the fin-arrangement of the condensation fins 10, relative to the auxiliary wick 9. The drains 11 are connected to the auxiliary wick 9 and the condensing fins 10.

The radiation fin 4 is for releasing heat (condensed latent heat of the refrigerant) emitted from the radiation wall 5 to the atmosphere. For example, the radiation fin 4 is made of aluminum so as to obtain a large heating area per unit weight, and is thermally connected to a surface of the radiation wall 5. The radiation fin 4 is bonded on an outer surface of the radiation wall 5 by brazing, after plating the copper-made radiation wall 5, for example.

An operation of the cooling device according to the first embodiment of the present embodiment will be described hereinafter.

Heat generated from the CPU 2 is transmitted to liquid refrigerant in the tank 3 through the heat-receiving wall 7 and the main wick 8, so that the liquid refrigerant in the tank 3 is boiled to be vapor refrigerant. While the vapor refrigerant flows in the vapor passages in the condensation fins 10, the vapor refrigerant is liquefied by releasing condensed latent heat to surfaces of the condensation fins 10 and the condensation plane 5'. The condensed latent heat is transmitted to the radiation fin 4 from the radiation wall 5 having the condensing fins 10, and further is discharged to the atmosphere. On the other hand, condensed liquid refrigerant on the surfaces of the condensation fins 10 is transported to the main wick 8 through the auxiliary wick 9.

By repeating the above refrigerant cycle (boiling-condensation-liquefaction) in the tank 3, heat emitted from the CPU 2 is successively released in the atmosphere so that the CPU 2 is cooled.

In the cooling device 1 according to the first embodiment, the auxiliary wick 9 is arranged to cross in the middle part of the condensation plane 5. That is, the auxiliary wick 9 is disposed opposite to a middle line of the attachment area 2' to extend from one end to the other end in the tank 3. Therefore, the vapor refrigerant boiled by receiving heat from the CPU 2 flows into both sides of the auxiliary wick 9 and circulates in the refrigerant tank 3 through the vapor passages provided by the condensation fins 10. Therefore, the flow of the vapor refrigerant is not disturbed by the auxiliary wick 9 and the circulation of the refrigerant is facilitated. That is, because the auxiliary wick 9 extends from one end to the other end to opposite to the middle line of the attachment area 2', vapor refrigerant boiled by receiving the heat from the CPU 2 readily flows to the condensation fins 10 at both sides of the auxiliary wick 9.

If the condensed liquid refrigerant stays in the spaces between the condensation fins 10, heat-transmitting area of refrigerant is decreased. However, in the first embodiment, since the condensed liquid refrigerant on the surfaces of the condensing fins 10 can be readily transported to the main wick 8 through the auxiliary wick 9, a sufficient cooling capacity can be obtained.

Moreover, since the surfaces of the condensation fins 10 are tilted in the approximate V-shape, the liquid refrigerant condensed on the condensation fins 10 is readily collected to troughs between the condensation fins 10. That is, because the trough between the condensation fins 10 functions as a drain of the condensed liquid refrigerant, the condensed liquid refrigerant is efficiency drained to the auxiliary wick 9 from the condensation fins 10.

Further, the both ends of the condensation fin 10 are cut at slant. Therefore, vapor passages can be provided between the end portions of the condensation fins 10 and the inner surface of the case 6, and between the end portions of the condensation fins 10 and the side wall of the auxiliary wick 9. Accordingly, each of the vapor passages provided by the condensation fins 10 is not closed, and the vapor refrigerant can smoothly and freely circulate in the vapor passages.

Figure 3B:
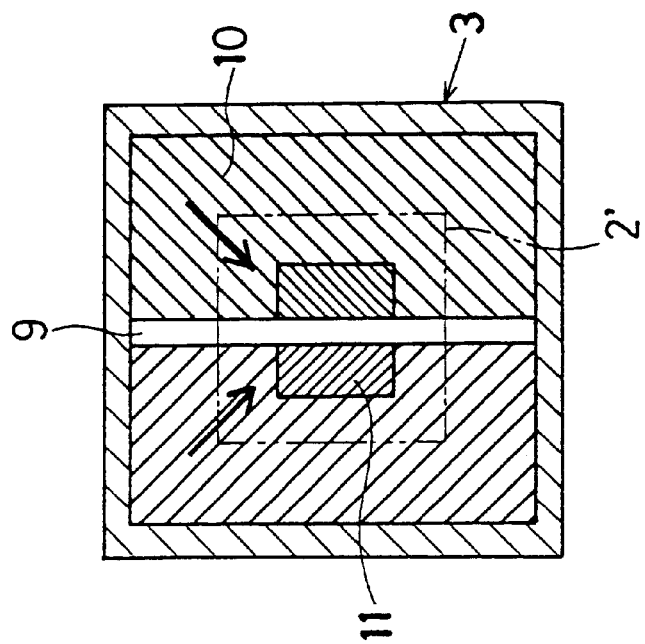
FIGS. 3A and 3B are sectional views each showing a fin-arrangement in a cooling device according to the first embodiment.

In the cooling device 1 of the first embodiment, since the condensation fins 10 provided on the radiation wall 5 are tilted by a predetermined angle with respect to the auxiliary wick 9. When the refrigerant tank 3 is used vertically so that the auxiliary wick 9 is positioned vertically as shown in FIG. 3B, the condensed liquid refrigerant on the surfaces of the condensation fins 10 can flow down along the surfaces of the condensing fins 10 by the gravity weight as shown by arrows in FIG. 3B. Therefore, the condensed liquid refrigerant can be easily absorbed to the main wick 8. That is, a circulation of the refrigerant from the surfaces of the condensation fins 10 to the main wick 8 can be performed in addition to the circulation of the refrigerant from the auxiliary wick 9 to the main wick 8. Accordingly, the refrigerant circulation is facilitated and cooling capacity of the cooling device is efficiently improved.

Figure 3A:
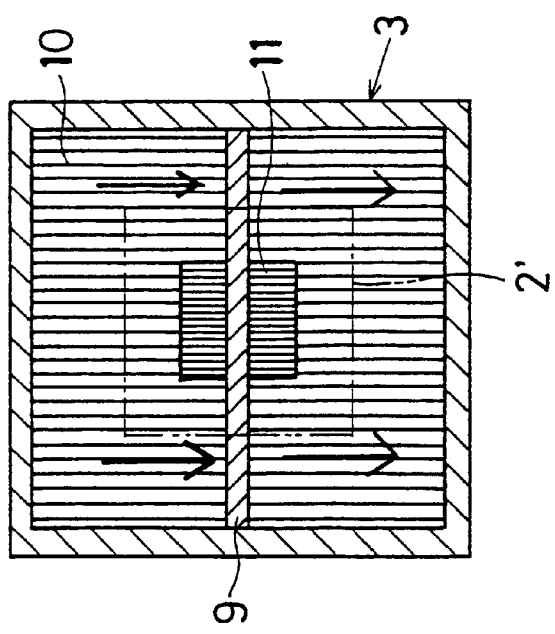

On the other hand, as shown in FIG. 3A, when the condensation fins 10 are vertically arranged with respect to the auxiliary wick 9 and the refrigerant tank 3 is used vertically, the condensed liquid refrigerant is efficiently drained on the condensation fins 10 above the auxiliary wick 9. However, in this case, under the auxiliary wick 9, the condensed liquid refrigerant flows down along the surfaces of the condensation fins 10 to the bottom of the refrigerant tank 3 by the gravity weight. In this case, the condensed liquid refrigerant is sucked up to the heat-generating portion (a boiling portion, attachment area 2') from the bottom by a capillary action of the main wick 8. Therefore, in this case shown in FIG. 3A, a fluid resistance of the liquid refrigerant is increased.

In the first embodiment, the condensation fins 10 are not provided in the middle portion of the condensation plane 5' of the radiation wall 5 in a rectangular area. Therefore, it can prevent the outer surface of the main wick 8 from being deformed by the press of the condensation fins 10 when the CPU 2 is mounted on the surface of the heat-receiving wall 7. Accordingly, an increase in the fluid resistance of the liquid refrigerant is restricted, and an inferior of the circulation of the liquid refrigerant transported through the main wick 8 can be suppressed.

Further, the drains 11 are provided in the middle portion of the condensation plane 5' of the radiation wall 5 to be recessed from the inner surface of the radiation wall 5. Therefore, the condensed liquid refrigerant is restricted from staying in the middle portion of the condensation plane 5' of the radiation wall 5. Moreover, an efficient condensation area is increased due to the drains 11, so that a heat radiation capacity is improved. Also, the drains 11 are connected to the auxiliary wick 9 through the trough between the condensation fins 10. Therefore, the condensed liquid refrigerant does not stay in the drain 11, and is absorbed by the auxiliary wick 9 to be satisfactorily drained from the drains 11. Here, it is desired that the region where the condensation fins 10 are not provided against the condensation plane 5' of the radiation wall 5 is within the attachment area 2' shown in the chain line of FIG. 1B.

In the cooling device of the first embodiment, the auxiliary wick 9 is disposed opposite to the middle line of the attachment area 2' (middle portion) and to extend from one end to the other end in the refrigerant tank 3. However, the auxiliary wick 9 can be disposed opposite to at least a part of attachment area 2'. Even in this case, condensed liquid refrigerant on the condensation fins 10 can be readily introduced to the main wick 8 through the auxiliary wick 9.

In the cooling device 1, because the radiation fin 4 is thoroughly brazed onto the radiation wall 5, there is no need to fix the radiation fin 4 to the radiation wall 5 with a screw, and a space for fastening the screw is saved. Therefore, the closed space inside the refrigerant tank 3 is increased so that a boiling area and a condensing area in the refrigerant tank 3 are increased. Accordingly, a heat resistance of the refrigerant tank 3 is decreased, and the cooling capacity is improved in the cooling device.

Further, since the radiation wall 5 is plated, a galvanic corrosion between two different metals is restricted. For example, it is possible to weld copper and aluminum together. Therefore, the refrigerant tank 3 made of copper having an excellent heat conductivity can be bonded to the radiation fin 4 made of aluminum having a large heat-transmitting area per unit weight. Thus, it is possible to provide the highly efficient, small and lightweight cooling device 1.

Moreover, a hydrophilic process can be applied to the condensation plane 5' of the radiation wall 5 to form a hydrophilic coat thereon, when water is used as the refrigerant. In this case, a moistness is increased on the condensation plane 5' which has a large radiation capacity per unit weight. Therefore, the heat resistance is decreased by the hydrophilic coat in the radiation wall.

Second Embodiment

Figure 4:
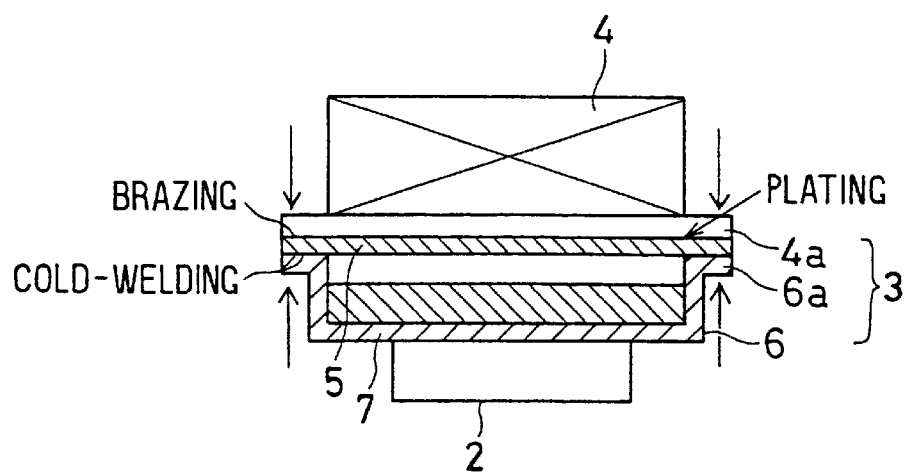
FIG. 4 is a schematic sectional view of a cooling device according to a second preferred embodiment of the present invention.

The second embodiment of the present invention will be described hereinafter with reference to FIG. 4.

In the second embodiment, after the radiation fin 4 is bonded (e.g. by brazing) to a plating surface of the radiation wall 5, an outer peripheral portion of the radiation wall 5 and a flange 6a provided on an outer periphery of the case 6 are cold-welded together with a substrate 4a of the radiation fin 4, for forming the refrigerant tank 3. In this case, a heating process such as a furnace welding is unnecessary for bonding the radiation wall 5 to the case 6.

Third Embodiment

The third embodiment of the present invention will be described hereinafter with reference to FIGS. 5A, 5B.

Figure 5B:
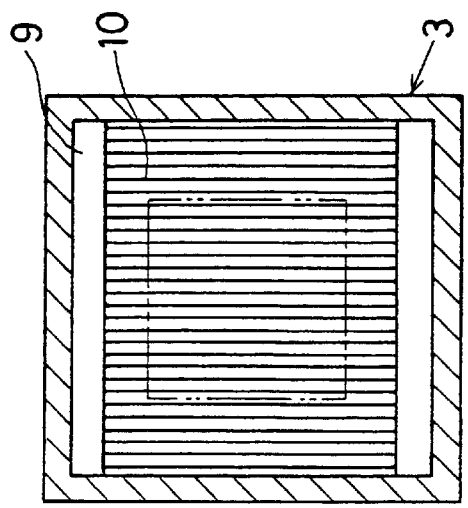
FIG. 5B is a cross-sectional view of the cooling device taken along line VB—VB in FIG. 5A, according to a third preferred embodiment of the present invention.
Figure 5A:
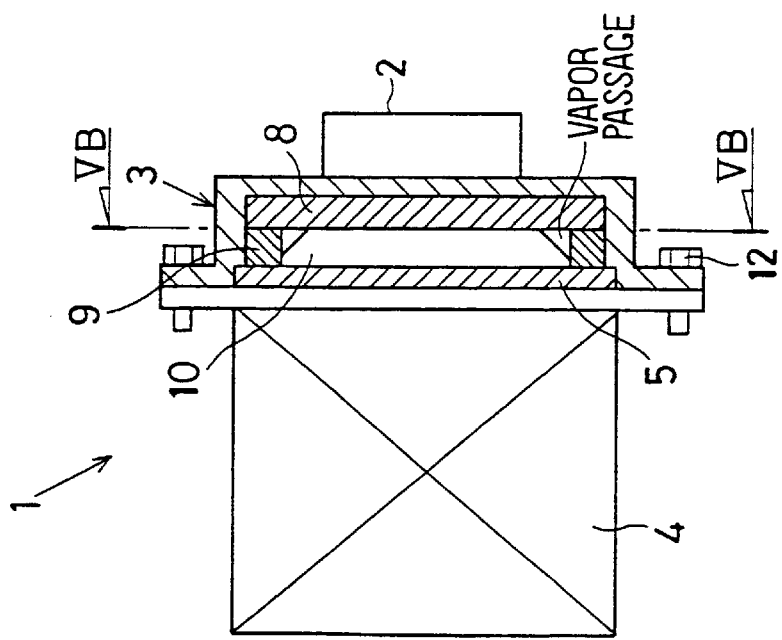
FIG. 5A is a schematic sectional view of a cooling device.

In the third embodiment, as shown in FIGS. 5A, 5B, both auxiliary wicks 9 are arranged at both side ends in the closed space of the refrigerant tank 3. Plural condensation fins 10 are arranged in parallel in the same direction to be perpendicular to the auxiliary wicks 9. Also, both side ends of each condensation fins 10 are connected to the auxiliary wicks 9. Similar to the first embodiment, both end surfaces of each condensation fin 10 are cut off obliquely.

In the third embodiment, because the auxiliary wicks 9 are arranged at both the side ends in the closed space of the refrigerant tank 3, the flow of the vapor refrigerant is not affected by the auxiliary wick 9 so that a circulation of the refrigerant in the refrigerant tank 3 is facilitated. Also, all the condensation fins 10 are arranged in the same direction, as shown in FIG. 5B, the condensation fins 10 can be extruded with the radiation wall 5 so that the condensation fin 10 is readily formed. Moreover, as shown in FIG. 5A, because the radiation fin 4 is fixed to the radiation wall 5 by fastening a screw 12, the radiation fin 4 can be detachable with respective to the refrigerant tank 3.

Fourth Embodiment

The fourth embodiment of the present invention will be described hereinafter with reference to FIGS. 6A, 6B.

Figure 6B:
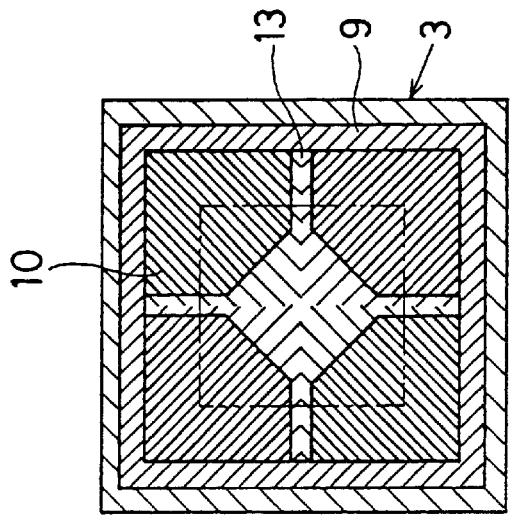
FIG. 6B is a cross-sectional view of the cooling device taken along line VIB—VIB in FIG. 6B, according to a fourth preferred embodiment of the present invention.
Figure 6A:
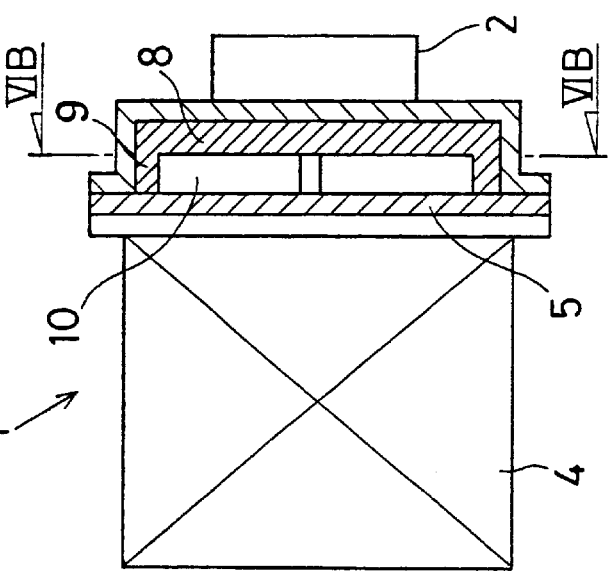
FIG. 6A is a schematic sectional view of a cooling device.

As shown in FIG. 6B, vapor passages 13 are provided in a cross with respect to the condensation surface of the radiation wall 5. The condensation fins 10 are radially provided in each area partitioned by the vapor passages 13. In addition, an auxiliary wick 9 is provided on an entire periphery in the closed space of the refrigerant tank 3.

In this structure of the fourth embodiment, the vapor refrigerant generated from the middle of the closed space of the refrigerant tank 3 can efficiently flow into the whole condensation fins 10 through the vapor passages 13. Further, as shown in FIG. 6A, the main wick 8, and the auxiliary wick 9 which is connected to the condensation fins 10 are integrally formed so that the structure of the cooling device can be simplified.

Modified Embodiment

In the above embodiments, the condensation fins 10 are integrally provided with the radiation wall 5. However, the condensation fins 10 and the radiation wall 5 may be separately formed. For example, a corrugated fin formed by folding a thin metallic plate made of aluminum and the like, may be welded on the condensation surface of the radiation wall 5.

The present invention should not be limited to the disclosed embodiments, but may be implemented in other ways without depending from the spirit of the invention.

What is claimed is:

1. A cooling device for cooling a heat-generating member, the cooling device comprising:

a tank for containing a predetermined amount refrigerant therein, the tank having a heat-receiving wall onto which the heat-generating member is attached in an attachment area, and a radiation wall opposite to the heat-receiving wall in a predetermined interval to form a closed space in the tank;

a radiation fin mounted on an outer surface of the radiation wall;

a main wick for transporting liquid refrigerant to the attachment area in the tank, the main wick being disposed in the tank to contact the heat-receiving wall;

a plurality of condensation fins disposed on the radiation wall in the tank; and an auxiliary wick disposed in the tank for connecting the main wick and the condensation fins, wherein the auxiliary wick is arranged at least opposite to a part of the attachment area.

2. The cooling device as in claim 1, wherein the auxiliary wick is disposed to opposite to a center line of the attachment area.

3. The cooling device as in claim 2, wherein the auxiliary wick extends in the tank from one end to the other end of the tank.

4. The cooling device as in claim 1, wherein the condensation fins are separately provided on both sides of the auxiliary wick, and obliquely arranged with respect to the auxiliary wick.

5. The cooling device as in claim 1, wherein the condensation fins are provided to protrude from an inner surface of the radiation wall to be tapered, for defining a V-shaped space between adjacent both the condensation fins.

6. The cooling device as in claim 1, wherein the condensation fins are disposed on an inner surface of the radiation wall except for at least a center area corresponding to a middle part within the attachment area.

7. The cooling device as in claim 6, further comprising a plurality of drains provided in the center area on the inner surface of the radiation wall to be recessed from the inner surface of the radiation wall, wherein the drains are provided to be connected to a space between the condensation fins.

8. The cooling device as in claim 1, wherein each condensation fin has an end surface in a longitudinal direction thereof, the end surface being tilted with respect to at least one of the auxiliary wick and a side inner surface of the tank.

9. The cooling device as in claim 1, wherein the radiation fin is bonded onto the outer surface of the radiation wall after the outer surface of the radiation wall is plated.

10. The cooling device as in claim 1, wherein the inner surface of radiation wall is applied with a hydrophilic coat.

11. The cooling device as in claim 1, wherein:

the tank is constructed by a flat plate used as the radiation wall, and a box-shaped case including to the heat-receiving wall; and the flat plate has an outer periphery which is disposed to be cold-bonded to a flange portion of an outer periphery of the box-shaped case by using a substrate of the radiation fin, after the radiation fin is bonded to the flat plate.

* * * * *